United States Patent
Narita et al.

(10) Patent No.: US 7,348,532 B2
(45) Date of Patent: Mar. 25, 2008

(54) METHOD OF MANUFACTURING A SOLID-STATE IMAGE-SENSING DEVICE INCLUDING FILLING UP A GAP WITH INSULATING RESIN, AND SOLID-STATE IMAGE-SENSING DEVICE

(75) Inventors: Hirochika Narita, Kanagawa (JP); Ryuya Kuroda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 108 days.

(21) Appl. No.: 11/433,502

(22) Filed: May 15, 2006

(65) Prior Publication Data

US 2006/0263942 A1 Nov. 23, 2006

(30) Foreign Application Priority Data

May 20, 2005 (JP) ............................. 2005-147611

(51) Int. Cl.
*H01L 27/00* (2006.01)
(52) U.S. Cl. .................... 250/208.1; 250/239
(58) Field of Classification Search ............ 250/203.1, 250/239, 214.1, 214 R; 257/433–435, 440, 257/290–292, 676, 678, 691; 438/123–128, 438/116, 64
See application file for complete search history.

(56) References Cited

U.S. PATENT DOCUMENTS 5,223,746 A * 6/1993 Abe et al. ................... 257/678

FOREIGN PATENT DOCUMENTS

| JP | 7-161949 | 6/1995 |
| JP | 2002-334995 | 11/2002 |
| JP | 2005-19680 | 1/2005 |

\* cited by examiner

*Primary Examiner*—Que T Le
(74) *Attorney, Agent, or Firm*—Young & Thompson (57) ABSTRACT

Method of manufacturing a solid-state image-sensing device includes: forming a composite lead frame which is a lead unit separated from a metal substrate surface by connecting a pair of lead frames having rectangular outer frame units, lead units formed integrally with the outer frame units within the frames, and bump units formed at one surface of the outer frame units, via the bump units of the lead frames on surfaces of both ends of the long plate-shaped metal substrate, filling up a gap between the surface of the metal substrate and the lead units with insulating resin, and forming an outer frame body by molding part of the composite lead frame so as to expose the connecting units and the lead unit to the outside, mounting a long plate-shaped solid state image sensing element on the composite lead frame, and cutting off the connecting units exposed to the outside.

7 Claims, 6 Drawing Sheets

PRIOR ART

METHOD OF MANUFACTURING A SOLID-STATE IMAGE-SENSING DEVICE INCLUDING FILLING UP A GAP WITH INSULATING RESIN, AND SOLID-STATE IMAGE-SENSING DEVICE

This application is based on Japanese patent application NO. 2005-147611, the content of which is incorporated hereinto by reference.

TECHNICAL FIELD

The present invention relates to a solid-state image-sensing device having a solid-state image-sensing element with a plurality of phototransistors formed in a line, and method of manufacturing thereof.

RELATED ART

Figure 6:
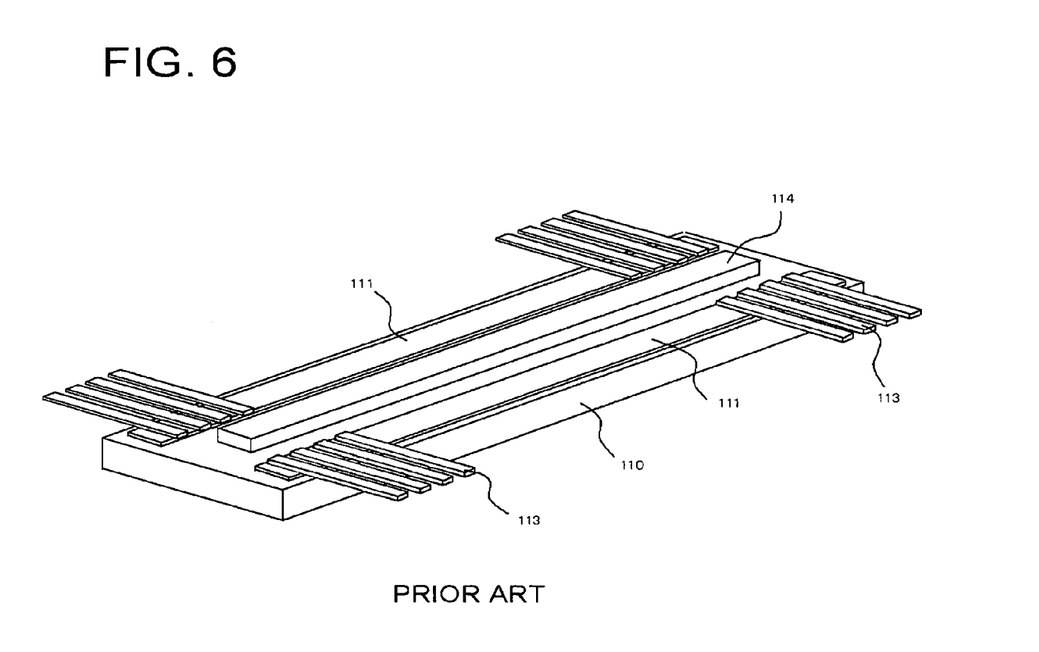
FIG. 6 is an outline perspective view of a solid-state image-sensing device of the related art.

That disclosed, for example, in Japanese Laid-open patent publication NO. H. 7-161949 may be given as a solid-state image-sensing device of the related art. An outline perspective view of a solid-state image-sensing device disclosed in the same document is shown in FIG. 6. As shown in FIG. 6, the solid-state image-sensing device has a long plate-shaped solid-state image-sensing element 114 mounted at a substantially central part of the surface of a ceramic substrate 110. A pair of pieces of fixing glass 111 for use in adhesion is provided at the surface of the ceramic substrate 110 so as to be substantially parallel to the solid-state image-sensing element 14. At the end sections of the ceramic substrate 110 in the longitudinal direction, lead units 113 are adhered via the fixing glass 111. The ceramic substrate 110, fixing glass 111, lead units 113, and solid-state image-sensing element 114 only are shown in the drawings, with other members being omitted from the drawings. In this way, at the solid-state image-sensing device of the related art, the lead units 113 are fixed directly to the surface of the ceramic substrate 110.

However, in recent years, the speed of CCD's has advanced and the amount of heat generated by the solid-state image-sensing element 114 has also increased. A metal substrate of superior thermal conductivity is used in order to raise the heat dissipation efficiency. However, a metal substrate is electrically conducting. It is therefore not possible to maintain reliable connections for the solid-state image-sensing device when the lead units are directly fixed to the substrate surface. Here, an insulating resin layer is interposed between the metal substrate and the lead units 113 as shown in Japanese Laid-open patent publication NO. 2002-334995 and Japanese Laid-open patent publication NO. 2005-19680 so as to provide electrical insulation. A method of manufacturing this kind of solid-state image-sensing device is disclosed in Japanese Laid-open patent publication NO. 2002-334995. Specifically, after connecting the metal substrate and the lead frame at two locations of an outer frame of the lead frame, and lead frame is pushed up from the substrate side, and the metal substrate and the lead frame are spaced from each other. After this, the metal substrate with the lead frame connected is housed within the metal mold, and molding is carried out using an insulating resin. As a result, between the metal substrate and the lead frame is filled up with insulating resin.

SUMMARY OF THE INVENTION

In Japanese Laid-open patent publication NO. 2002-334995 and Japanese Laid-open patent publication NO. 2005-19680, between the metal substrate and the lead frame is filled up with insulating resin so that insulation of the metal substrate and the lead frame is ensured. However, in recent years, as solid-state image-sensing devices have become smaller, the drop in the reliability of the connections of solid-state image-sensing devices have become more pronounced. Namely, the distances between the metal substrates and lead frames have become shorter as a result of the solid-state image-sensing devices becoming smaller, and these make contact so as to bring about the possibility of insulation defects. Because of this, in order to ensure insulation, it is necessary to reliably ensure a distance between the metal substrate and the lead frame. However, with the method disclosed in Japanese Laid-open patent publication NO. 2002-334995, after connecting the lead frame to the metal substrate surface, the lead frame is pushed up from the substrate side, the lead frame becomes too far spaced from the metal substrate, and distancing of the two in a precise manner becomes difficult. Because of this, it is not possible for these to be reliably distanced, and there is the fear that the connection reliability the solid-state image-sensing device will fall.

According to the present invention, there is provided a method of manufacturing a solid-state image-sensing device of the present invention comprises: forming a composite lead frame separating a lead unit and a metal substrate surface by connecting a pair of lead frames having rectangular outer frame units, lead units formed integrally with the outer frame units within the frames, and bump units formed at one surface of the outer frame units, via the bump units of the lead frames on surfaces of both ends of the long plate-shaped metal substrate, supplying insulating resin to within a metal mold housing the composite lead frame, filling up a gap between the surface of the metal substrate and the lead units with the insulating resin, and forming an outer frame body by molding part of the composite lead frame in such a manner as to expose the connecting units of the outer frame unit and the lead unit to the outside, by supplying insulating resin to within a metal mold housing the composite lead frame, mounting a long plate-shaped solid state image sensing element on the composite lead frame with the outer frame body, and cutting off the connecting units exposed to the outside of the outer frame body.

According to present invention, a bump unit is formed in advance at one surface of the outer frame unit of the lead frame, this pair of lead frames are connected to the surfaces of both end sections of the long plate-shaped metal substrate, and a composite frame is formed. As a result, insulation between the metal substrate and the lead frame can be reliably ensured.

On the other hand, in a method of manufacturing a solid-state image-sensing device as disclosed in Japanese Laid-open patent publication NO. 2002-334995, after connecting the lead frame to the surface of the metal substrate, the lead frame is pushed upwards from the substrate side, and the metal substrate and lead frame are spaced. In this kind of method, it is difficult to space the metal substrate and the lead frame with high precise, and the spacing of these is therefore difficult.

In this respect, according to the method of present invention, bump units are formed in advance at one surface of the outer frame units of the lead frames, and are connected to the surfaces of both end sections of the long plate-shaped metal substrate, and a composite frame is formed. As a result, it is possible to space the metal substrate and the lead frame in a more precise manner, and the insulation thereof can be reliably maintained. The connection reliability of the solid-state image-sensing device can therefore be improved by using this composite lead frame.

According to a method of manufacturing a solid-state image-sensing device of the present invention, as insulation between the metal substrate and the lead frame is maintained, it is possible to obtain a solid-state image-sensing device where connection reliability is improved.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The following is a description given using the drawings of a preferred embodiment of the present invention. In all of the drawings, the same elements of the configuration are given the same numerals and descriptions thereof are omitted as appropriate.

In present embodiment, the method of manufacturing a solid-state image-sensing device is described in detail with reference to FIG. 1 to FIG. 5.

Figure 3A:
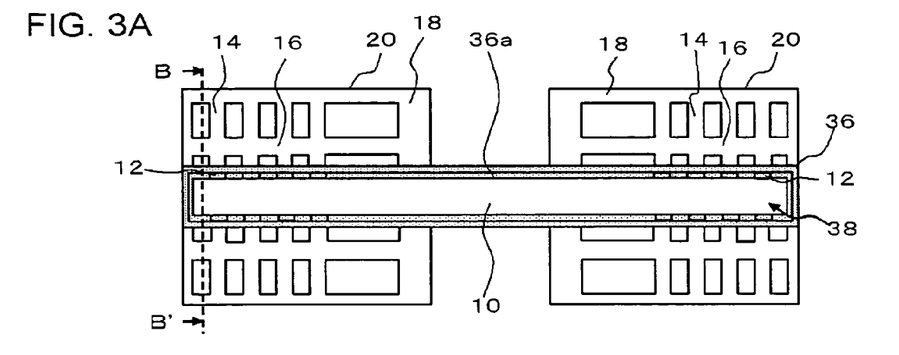
FIG. 3A is a top view and FIG. 3B is a perspective view of steps occurring in steps for manufacturing the solid-state image-sensing device of present embodiment.
Figure 3B:
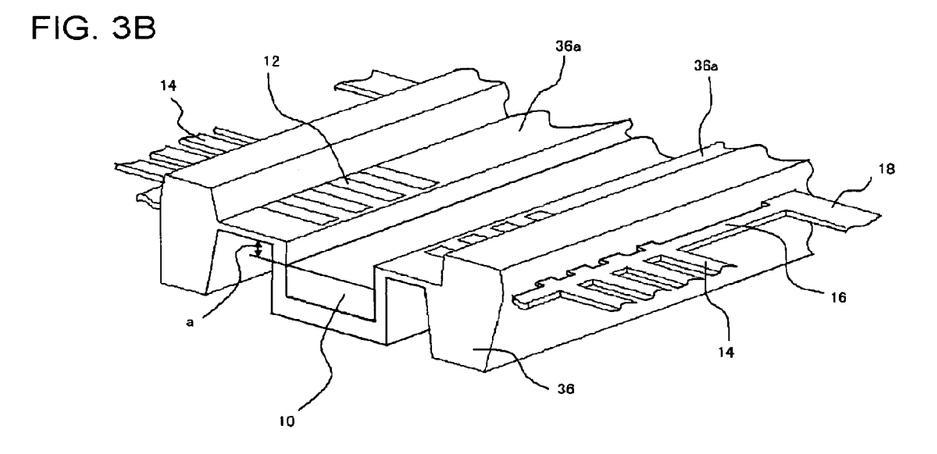
Figure 4:
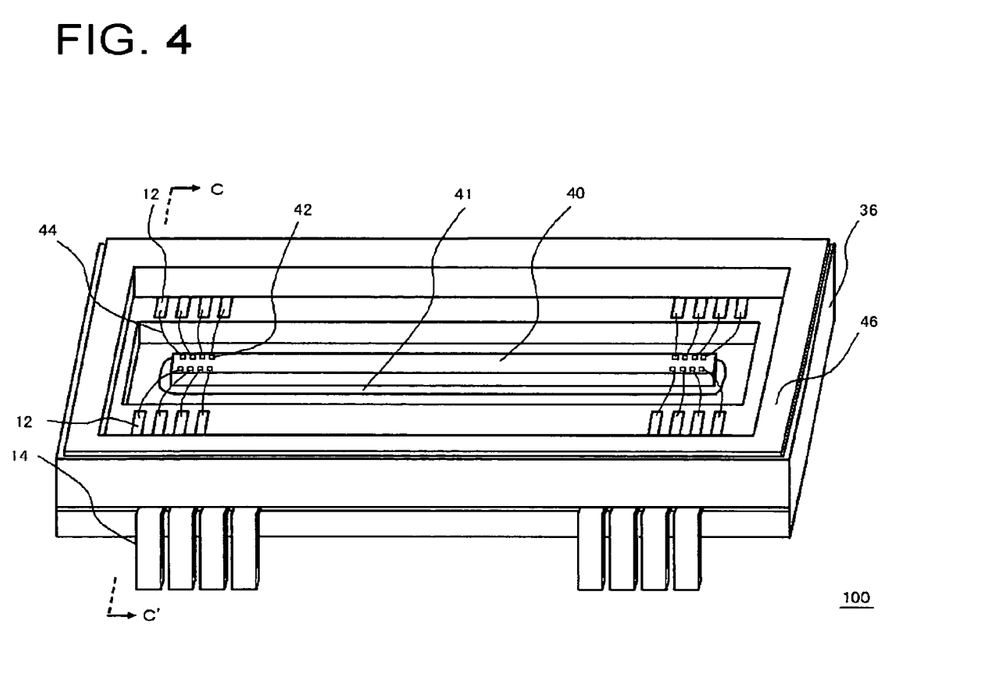
FIG. 4 is an outline perspective view of a solid-state image-sensing device obtained using the manufacturing method of present embodiment.
Figure 5:
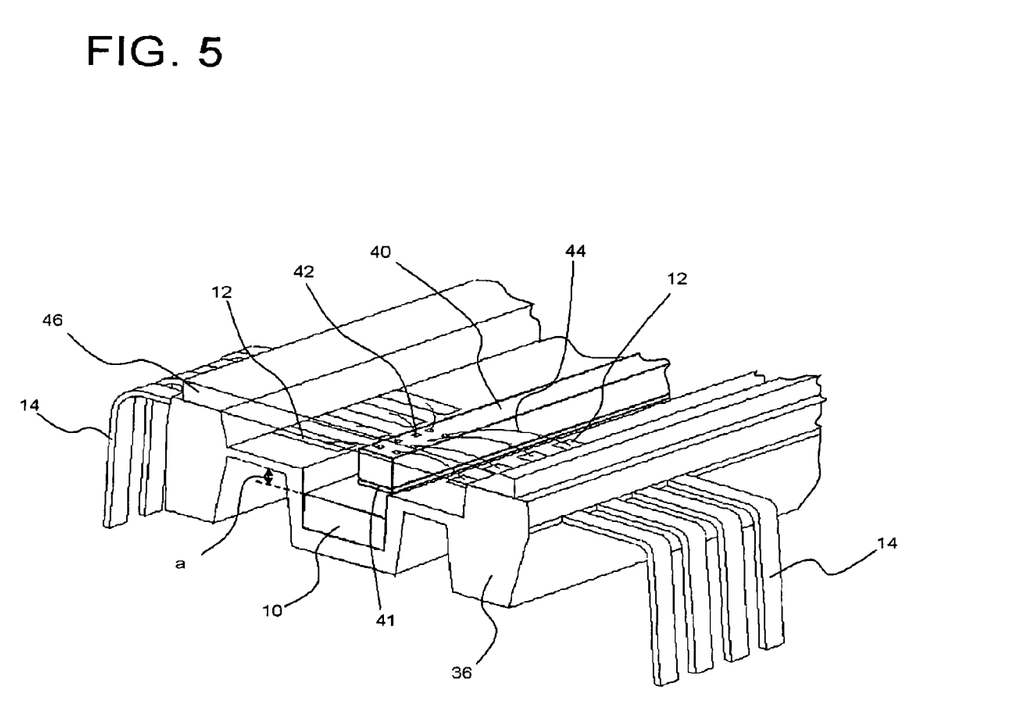
FIG. 5 is a cross-sectional perspective view along line C-C' of the solid-state image-sensing device shown in FIG. 4.

The method of manufacturing a solid-state image-sensing device of present embodiment comprises forming a composite lead frame 20 which is separated a lead unit 17 from a surface of a metal substrate 10 by connecting a pair of lead frames 20 having rectangular outer frame units 18, lead units 17 formed integrally with the outer frame units 18 within the frames, and bump units formed at one surface of the outer frame units 18, via the bump units of the lead frames 20 on surfaces of both ends of the long plate-shaped metal substrate 10 (FIG. 1), filling up a gap between the surface of the metal substrate 10 and the lead units 17 with the insulating resin, and forming an outer frame body 18 by molding part of the composite lead frame 30 in such a manner as to expose the connecting units of the outer frame unit 18 and the lead unit 17 to the outside, by supplying insulating resin to within a metal mold housing the composite lead frame (FIG. 2 and FIG. 3), mounting a long plate-shaped solid state image sensing element 40 on the composite lead frame 30 with the outer frame body 36 (FIG. 4), and cutting off the connecting units exposed to the outside of the outer frame body 36 (FIG. 4).

The following is a description of the method of manufacturing a solid-state image-sensing device of present embodiment, in the order of steps.

Figure 1:
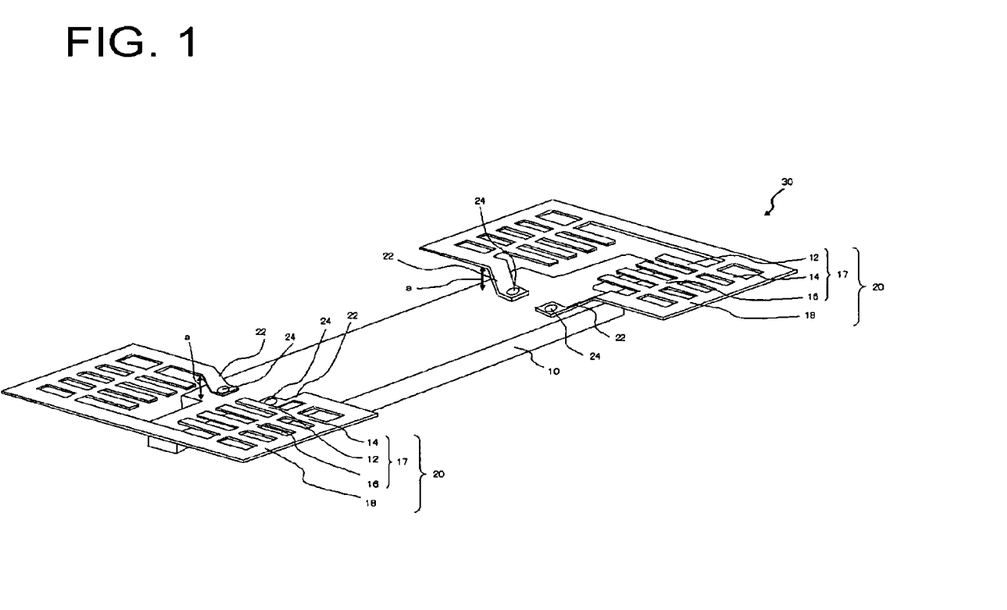
FIG. 1 is a top view of steps showing steps for manufacturing the solid-state image-sensing device of present embodiment.

First, there is a step of connecting a pair of lead frames 20 having rectangular-shaped outer frame units 18, lead units 17 formed integrally with the outer frame units 18 inside the frame, and bump units formed at one surface of the outer frame units 18 to both end section surfaces of a long plate-shaped metal substrate 10 at the bump units so as to form a composite lead frame 30 (FIG. 1).

It is also possible to use a heat sink of an iron or an alloy taking iron as a main component, or a heat sink of copper or an alloy taking copper as a main component as the metal substrate 10. In present embodiment, it is preferable to use a heat sink of an iron or an alloy taking iron as a main component. The surface of the heat sink may be blackened. In this case, it is possible to provide resistance to rusting and corrosion and suppress diffuse reflection. The width of both end sections of the metal substrate 10 is configured so as to be narrower than the width of this central unit.

The lead frames 20 are comprised of rectangular outer frame units 18, and lead units 17 formed integrally with the outer frame units 18 inside the frame. The lead frames are composed of inner leads 12, outer leads 14, and tie bars 16 mutually connected together. The bump units are formed integrally with the outer frame units 18 by bending the outer frame units 18. Specifically, a process of pushing down the pair of end sections of the outer frame unit of the lead frame plate using a predetermined method is carried out (downset), and the lead frame 20 shown in FIG. 1 can be obtained by forming the pair of connecting units 22 (bump units). The connecting units 22 have inclined surfaces provided by bending the outer frame unit 18 and have connecting surfaces for connecting with the metal substrate 10. The connecting units 22 are positioned downwards by a distance a from the surface of the lead frame 20. The distance a is set in a range in the order of greater than or equal to 100 μm to less than or equal to 600 μm. Variation in the distance a can be managed to ±10 μm using the precision of the pressing down processing. In this way, the lead frame plate is made to curve in advance, and the precision of the spacing of the metal substrate and the lead frame can be made to be precise by using the lead frame 20 formed with bump units. Because of this, the insulation for these items can be reliably maintained and the connection reliability the solid-state image-sensing device can be improved.

The connecting units 22 connect, for example, a camera etc. to the surface of both of the end sections of the metal substrate 10 via predetermined connecting units 24 such as connection by caulking so as to form a composite lead frame 30 with the lead units 17 and the surface of the metal substrate 10 spaced by a predetermined distance. By using a lead frame of this kind of shape, the surface of the metal substrate 10 and the lower surfaces of the lead frames 20 are separated by the distance a. Because of this, the metal substrate 10 and the lead frames 20 are reliably insulated, and the reliability of the connections of the solid-state image-sensing device are improved.

Figure 2A:
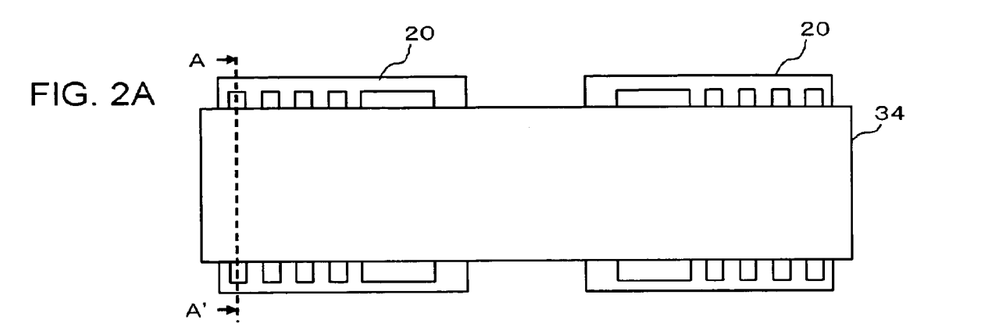
FIG. 2A is a top view and FIGS. 2B and 2C are perspective views of steps showing steps for manufacturing the solid-state image-sensing device of present embodiment.
Figure 2B:
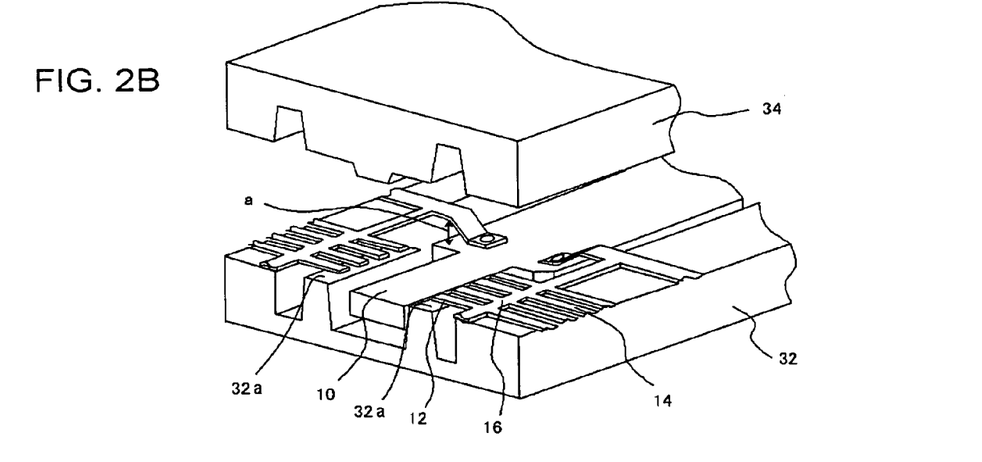
Figure 2C:
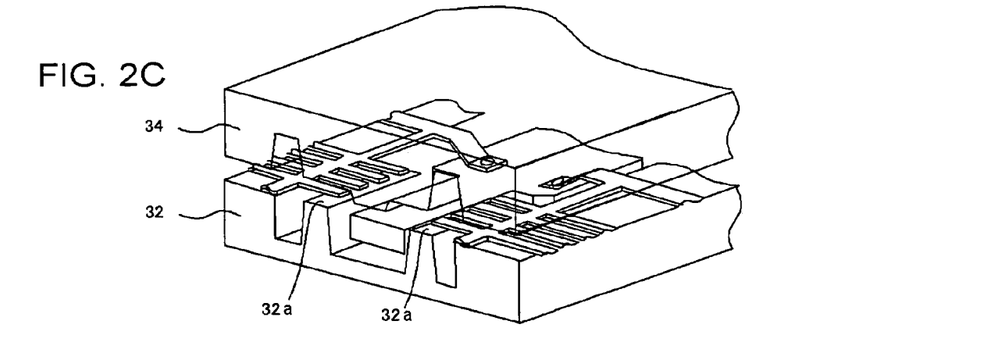

Next, insulating resin is supplied to within the metal mold housing the composite lead frame 30, the gap between the surface of the metal substrate 10 and the lead unit 17 is filled up with the insulating resin, and an outer frame body 36 is formed by molding part of the composite lead frame 30 in such a manner as to expose the connecting units of the outer frame unit 18 and the lead unit 17 to the outside (FIG. 2 and FIG. 3).

First, the composite lead frame 30 shown in the top view of FIG. 2A is housed within the metal mold. The process of housing the composite lead frame 30 in the metal mold is described with reference to FIG. 2B and FIG. 2C. FIG. 2B and FIG. 2C are cross-unital perspective views along line A-A' of the process view shown in FIG. 2A. FIG. 2C is a view as viewed through an upper metal mold 34.

First, as shown in FIG. 2B, the lead frame 20 of the composite lead frame 30 is set on a lower metal mold 32. In present embodiment, the width of the ends in the longitudinal direction of the metal substrate 10 is formed so as to be narrower than the width of this central unit. The inner lead 12 positioned on both sides of both of the ends of the metal substrate 10 can then be mounted on a projecting surface 32a of the lower metal mold 32. The projecting surface 32a is formed so as to project from the bottom surface of a concave portion of the lower metal mold 32. By setting the inner lead 12 at the projecting surface 32a, the projecting surface 32a is positioned up by just a distance a from the surface of the metal substrate 10. Next, as shown in FIG. 2C, the composite lead frame 30 is sandwiched by the lower metal mold 32 and the upper metal mold 34. The upper metal mold 34 is provided with a step in such a manner as to come into contact with the upper surface of the inner lead 12 and the surface of the metal substrate 10. The step of the upper metal mold 34 can be formed so as to give clearance of distance a between the metal substrate 10 and the inner lead 12. By using the lower metal mold 32 and the upper metal mold 34 in this manner, it is possible to reliably space the metal substrate 10 and the inner lead 12 by a distance a. Further, after molding, part of the surface of the metal substrate 10 can be exposed.

After the composite lead frame 30 is sandwiched by the lower metal mold 32 and the upper metal mold 34, insulating resin is supplied to within the upper and lower metal molds and hardened, part of the composite lead frame 30 is molded, and the outer frame body 36 is formed as shown in the top view of FIG. 3A. The outer frame body 36 is formed of box shape opened at an upper, and the inner wall of the outer frame body 36 is formed in two stages. A cross-unital perspective view along line B-B' of the composite lead frame 30 of FIG. 3A is shown in FIG. 3B. As shown in FIG. 3B, the surface of an inner lead 12 is exposed at the lower step surface 36a of the inner wall of the outer frame body 36. Further, the surface of the metal substrate 10 is exposed at the bottom surface within the outer frame body 36. Moreover, an insulating resin layer of a fixed height corresponding to the distance a is interposed between the metal substrate 10 and the lead frame 20 (inner leads 12). As a result, the metal substrate 10 and the lead frames 20 can be reliably insulated. Further, the connecting units of the outer frame units 18 and the lead units 17 are exposed to the outside. Specifically, the connecting units of the lead units 17 and the outer frame units 18 contain the connecting units of the outer frame units 18 and the tie bars 16, and the connecting units of the outer frame units 18 and the outer leads 14. In the following process, the metal substrate 10 and the lead units 17 are electrically insulated by cutting this connecting unit. The cutting of the connecting units of the outer frame units 18 and the tie bars 16 and the process of bending portions of the outer leads 14 may also be carried out in advance at this stage.

Next, a long plate-shaped solid-state image-sensing element 40 is mounted on the composite lead frame 30 with outer frame body (FIG. 4).

As shown in FIG. 4, the long plate-shaped solid-state image-sensing element 40 is fixed to the surface of the metal substrate 10 exposed within the outer frame body 36, and the pair of inner leads 12 and bonding pads 42 of the solid-state image-sensing element 40 are electrically connected via the bonding wires 44.

First, the solid-state image-sensing element 40 is fixed using adhesive 41 to a substantially central part of the surface of the metal substrate 10 exposed within the outer frame body 36. The solid-state image-sensing element 40 is, for example, a long plate-shape 30 to 90 mm long, 0.3 mm to 1.0 mm wide, 0.4 mm to 0.7 mm thick, and contains a plurality of bonding pads 42 at both ends in a longitudinal direction. Next, the surface of the inner leads 12 exposed within the outer frame body 36 and the bonding pad 42 provided at the surface of the solid-state image-sensing element 40 are each connected using bonding wires 44.

The connecting units of the outer frame units 18 and the lead units 17 exposed to the outside of the outer frame body 36 is then separated and the solid-state image-sensing device is made. As described above, the connecting units contain the connecting units of the outer frame units 18 and the tie bars 16 and the connecting units of the outer frame units 18 and the outer leads 14. It is therefore possible to electrically insulate the metal substrate 10 and the lead units 17 by cutting off these connecting units. Specifically, the outer frame units 18 exposed to the outside of the outer frame body 36 are cut, and the tie bars 16 are cut off.

A glass plate 46 is then adhered to the upper end section of the outer frame body 36, and after sealing the upper unit opening of the outer frame body 36 formed of concave in cross-section, the outer lead 14 is bent, and the solid-state image-sensing device 100 is made.

The solid-state image-sensing device 100 manufactured in this way is, for example, a long plate-shape 100 mm long, 15 mm wide, and 10 mm thick. The solid-state image-sensing element is capable of being used in electronics device having an image scanning function such as a copier or scanner etc. taken as a line sensor.

The following is a description of the results for the method of manufacturing a solid-state image-sensing element of present embodiment.

In present embodiment, bump units are formed in advance on one surface of the outer frame units of the lead frames, these are connected to the surface of both end sections of the long plate-shaped metal substrate at the bump units, a composite lead frame is formed, and a solid-state image-sensing device is made using this composite lead frame. As a result, the metal substrate and the lead frame can be spaced from each other with high precise, and insulation thereof can be maintained in a reliable manner.

On the other hand, with the method of manufacturing a solid-state image-sensing device of the related art, after connecting the lead frames directly to the surface of the metal substrate, the lead frame is lifted up from the substrate side at using a lifting pin, and a space is created between the substrate and the lead frame. However, with this kind of method, it was not possible to precisely and reliably space the metal substrate and the lead frame. Namely, with solid-state image-sensing devices of recent years, the distance of spacing the lead from the metal substrate is extremely short, and precise spacing using a lifting pin is extremely difficult. As a result, the metal substrate surface and lead frame make contact without any clearance, and it is feared that the connection reliability the solid-state image-sensing device may fall. In recent years, this problem as become more marked as solid-state image-sensing devices have become more finely detailed, and this problem did not exist with solid-state image-sensing devices of the related art.

In this respect, according to present embodiment, bump units (connecting units 22) are formed in advance on one surface of the outer frame units 18 of the lead frames 20, these are connected to the surface of both end sections of the long plate-shaped metal substrate 10 at the bump units, a composite lead frame 30 is formed, and a solid-state image-sensing device 30 is made using this composite lead frame. According to this method, it is possible for the metal substrate and the lead frame to be separated with high precise compared to the method disclosed in Japanese Laid-open patent publication NO. 2002-334995 where the lead frame is pushed upwards from below after connecting the lead frame above the metal substrate. Because of this, the insulation for these items can be reliably maintained and the connection reliability the solid-state image-sensing device can be improved.

Further, in present embodiment, the width of both end sections in a longitudinal direction of the metal substrate 10 can be made narrower than the width of the central unit.

As a result, while the composite lead frame 30 is housed vertically between lower and upper metal mold, the inner lead 12 is directly set on the lower metal mold 32, and the inner lead 12 and metal substrate 10 are spaced by the distance a. The inner lead 12 is at a location where electrical connection with the bonding pad 42 takes place. It is therefore possible to ensure that insulation of the metal substrate 10 and the lead frames 20 is effectively maintained by reliably spacing the inner lead 12 and the metal substrate 10. In this way, the connection reliability of the solid-state image-sensing device is further improved.

In the above, a description is given of the embodiments of the present invention with reference to the drawings but this merely illustrates examples of the present invention, and various other configurations can also be adopted.

For example, in present embodiment, a description is given of an example where the outer frame unit 18 itself projects outwards and is taken as the connecting units 22. However, it is also possible to form bump units constituting the connecting units by fixing other members to one surface of the outer frame unit 18 if the metal substrate 10 and lead frames 20 are able to be separated. In present embodiment, a description is given of an example where the width of both end sections of the metal substrate 10 is configured to be narrower than the width of this central unit but it is also possible to use a plate-shaped metal substrate 10 having a fixed width in the longitudinal direction within a range that is not detrimental to the effects of the present invention.

It is apparent that the present invention is not limited to the above embodiment, that may be modified and changed without departing from the scope and spirit of the invention.

What is claimed is:

1. A method of manufacturing a solid-state image-sensing device comprising:

forming a composite lead frame which is separated a lead unit from a metal substrate surface by connecting a pair of lead frames having rectangular outer frame units, lead units formed integrally with the outer frame units within the frames, and bump units formed at one surface of the outer frame units, via the bump units of the lead frames on surfaces of both ends of a long plate-shaped metal substrate, filling up a gap between the surface of the metal substrate and the lead units with insulating resin, and forming an outer frame body by molding part of the composite lead frame in such a manner as to expose the connecting units of the outer frame units and the lead unit to the outside, by supplying insulating resin to within a metal mold housing the composite lead frame, mounting a long plate-shaped solid state image sensing element on the composite lead frame with the outer frame body, and cutting off the connecting units exposed to the outside of the outer frame body.

2. The method of manufacturing a solid-state image-sensing device according to claim 1, wherein the outer frame unit and the bump unit are formed integrally.

3. The method of manufacturing a solid-state image-sensing device according to claim 1, wherein said method comprising providing a lead frame plate having rectangular outer frame units, and lead units formed integrally with outer frame units within the frames, and forming bump units formed integrally with the outer frame units by pressing out part of the outer frame unit of this lead frame plate in one direction, before the forming the composite lead frame.

4. The method of manufacturing a solid-state image-sensing device according to claim 1, wherein the width of both end sections in a longitudinal direction of the metal substrate is narrower than the width of this central unit.

5. The method of manufacturing a solid-state image-sensing device according to claim 1, wherein the lead unit comprises an inner lead electrically connected to the solid-state image-sensing element, and the molding the outer frame body comprising setting the composite lead frame on the lower metal mold in such a manner that the lower surfaces of the inner leads positioned to the sides of both end sections of the metal substrate come into contact with the lower metal mold, and sandwiching the composite lead frame by the upper metal mold and the lower metal mold, and molding the outer frame body by supplying insulating resin to within the metal mold and being hardened.

6. The method of manufacturing a solid-state image-sensing device according to claim 1, wherein the metal layer substrate is comprised of an iron or an alloy mainly composed of an iron.

7. A solid-state image-sensing device obtained using the method of manufacturing a solid-state image-sensing device disclosed in claim 1.

* * * * *